(12) United States Patent
Nakamura et al.

(10) Patent No.: US 9,989,657 B2
(45) Date of Patent: Jun. 5, 2018

(54) READOUT CIRCUIT

(71) Applicant: HAMAMATSU PHOTONICS K.K., Hamamatsu-shi, Shizuoka (JP)

(72) Inventors: Shigeyuki Nakamura, Hamamatsu (JP); Tsuyoshi Ohta, Hamamatsu (JP); Michito Hirayanagi, Hamamatsu (JP); Hiroki Suzuki, Hamamatsu (JP); Shunsuke Adachi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days. days.

(21) Appl. No.: 15/335,588

(22) Filed: Oct. 27, 2016

(65) Prior Publication Data
US 2017/0123082 A1 May 4, 2017

(30) Foreign Application Priority Data
Oct. 28, 2015 (JP) .................. 2015-211886

(51) Int. Cl.
*G01T 1/24* (2006.01)
*G01T 1/18* (2006.01)
*H01L 31/02* (2006.01)

(52) U.S. Cl.
CPC ............... *G01T 1/247* (2013.01); *G01T 1/18* (2013.01); *H01L 31/02027* (2013.01)

(58) Field of Classification Search
CPC ......... G01T 1/24; G01T 1/2928; G01T 1/026; H04N 5/32; H01L 27/14692
See application file for complete search history.

(56) References Cited

U.S. PATENT DOCUMENTS

| 7,512,210 | B2 | 3/2009 | Possin et al. |
| 9,405,023 | B2* | 8/2016 | Guo ................ G01T 1/2985 |
| 2016/0033654 | A1* | 2/2016 | Tamura ............ G01T 1/2985 |
| | | | 378/98.9 |

FOREIGN PATENT DOCUMENTS

| JP | H03-181825 A | 8/1991 |
| JP | H07-18757 B2 | 3/1995 |
| JP | 2567908 Y2 | 4/1998 |

\* cited by examiner

*Primary Examiner* — David Porta
*Assistant Examiner* — Mamadou Faye
(74) *Attorney, Agent, or Firm* — Drinker Biddle & Reath LLP

(57) ABSTRACT

A readout circuit for reading out an output current from a photoelectric conversion element which collectively outputs currents generated in a plurality of pixels, each of which includes an avalanche photodiode, includes a current mirror circuit configured to receive the output current and output first and second currents having magnitudes in proportion to the output current, a photon counting circuit configured to count the number of photons incident on the photoelectric conversion element on the basis of the first current, an integral circuit configured to integrate the second current to generate a voltage signal, and a signal processing unit configured to determine a magnitude of light incident on the photoelectric conversion element on the basis of a counting result output from the photon counting circuit and a magnitude of the voltage signal output from the integral circuit.

1 Claim, 8 Drawing Sheets

READOUT CIRCUIT

TECHNICAL FIELD

An aspect of the present invention relates to a circuit which reads out an output current from a photoelectric conversion element.

BACKGROUND

In Japanese Unexamined Patent Publication No. H3-181825, technology related to a photometric device for counting photons is disclosed. This device includes a photon counting circuit, a direct current component measuring circuit, and a photometric value output circuit. The photon counting circuit outputs a pulse signal having a predetermined wave height or more among pulse signals output from a photomultiplier tube. A direct current component measuring circuit detects a direct current level according to an amount of light of the pulse signal output from the photomultiplier tube and outputs a pulse signal of a pulse interval corresponding to the direct current level. The photometric value output circuit counts pulse signals output from one or both of the photon counting circuit and the direct current component measuring circuit to output a photometric value.

In Japanese Utility Model Registration No. 2567908, technology related to a light amount sensor is disclosed. This light amount sensor includes a plurality of light receiving elements, a photon counting circuit and an analog photometric circuit which process output signals from the light receiving elements, and a signal calculation circuit. The signal calculation circuit includes two correction circuits which correct outputs of the photon counting circuit and the analog photometric circuit, two weight calculation circuits, each of which multiplies an output of the two correction circuits by a weight, and an adding circuit which adds outputs of the two weight calculation circuits.

SUMMARY

As a photoelectric conversion element for detecting weak light, a structure in which pixels each including an avalanche photodiode (hereinafter, APD) are two-dimensionally arranged is known. In this photoelectric conversion element, it is possible to precisely measure an amount of weak incident light for the photoelectric conversion element by supplying a common bias voltage to the pixels and collectively outputting currents of the pixels to perform photon counting. As this photoelectric conversion device, for example, there is MPPC (registered trademark) of Hamamatsu Photonics K. K.

However, it is desirable to cope with a wide range of amounts of light from a weak amount of light to a relatively large amount of light in a circuit which reads out an output current from a photoelectric conversion element according to an extension of an application range of the photoelectric conversion element. An aspect of the present invention has been made in view of this problem and an objective of the present invention is to provide a readout circuit capable of coping with a wide range of amounts of light.

To solve the above-described problem, a readout circuit according to an aspect of the present invention is a readout circuit for reading out an output current from a photoelectric conversion element which collectively outputs currents generated in a plurality of pixels, each of which includes an avalanche photodiode, the readout circuit including: a current mirror circuit configured to receive the output current and output first and second currents having magnitudes in proportion to the output current; a photon counting circuit configured to count the number of photons incident on the photoelectric conversion element on the basis of the first current; an integral circuit configured to integrate the second current to generate a voltage signal; and a signal processing unit configured to determine a magnitude of light incident on the photoelectric conversion element on the basis of a counting result output from the photon counting circuit and a magnitude of the voltage signal output from the integral circuit.

This readout circuit includes a current mirror circuit, so that the first current to be supplied to the photon counting circuit and the second current to be supplied to the integral circuit can be obtained without affecting each other. Because it is possible to freely determine a ratio of the second current to the output current, the integral circuit increases a saturation amount of light, thereby sufficiently extending a range of amounts of light.

Also, in the readout circuit, the current mirror circuit may output N (N is an integer greater than or equal to 3) currents having magnitudes in proportion to the output current, the photon counting circuit may input one current of the N currents as the first current, and the integral circuit may input one current different from a current input by the photon counting circuit among the N currents as the second current. Thereby, it is possible to easily change a ratio of an input current for the photon counting circuit and a ratio of an input current for the integral circuit with respect to an output current from the photoelectric conversion element. Accordingly, it is possible to easily select an appropriate ratio according to a characteristic, a field of application, or the like of the photoelectric conversion element connected to the readout circuit.

According to an aspect of the present invention, it is possible to provide a readout circuit capable of coping with a wide range of amounts of light.

DETAILED DESCRIPTION

Hereinafter, an embodiment of a readout circuit according to an aspect of the present invention will be described in detail with reference to the accompanying drawings. The same elements are denoted by the same reference signs in the description of the drawings and redundant description thereof will be omitted.

Figure 1:
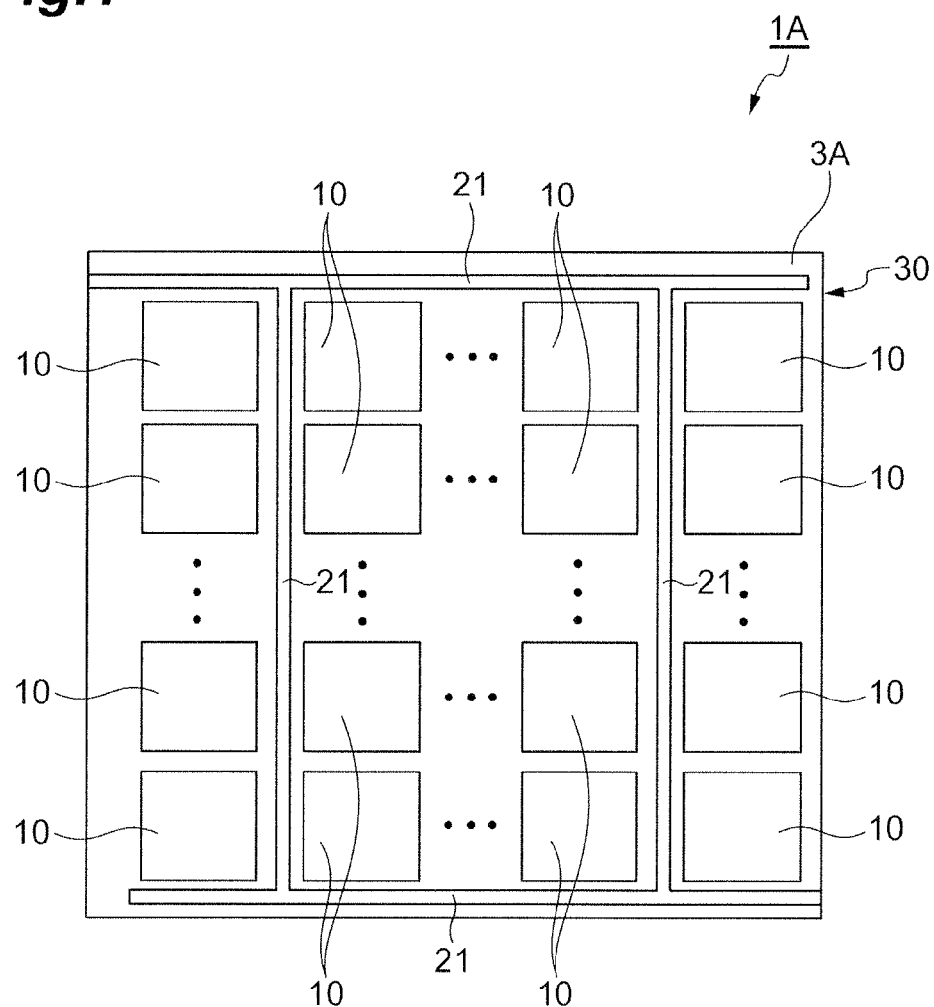
FIG. 1 is a plan view of a photoelectric conversion element according to an embodiment.

FIG. 1 is a plan view of a photoelectric conversion element 1A according to an embodiment. The photoelectric conversion element 1A includes a semiconductor substrate 30. An upper portion of a principal surface of the semiconductor substrate 30 serves as a light receiving unit 3A which receives light. In the light receiving unit 3A, a plurality of pixels 10 are arranged in a two-dimensional shape (a matrix shape). Each of the plurality of pixels 10 is configured to include an APD which operates according to a common bias voltage. A pitch (a central spacing) of the plurality of pixels 10 is, for example, 50 μm.

The photoelectric conversion element 1A further includes a signal readout wire 21. The wire 21 is electrically connected to the plurality of pixels 10 and collectively reads out output currents from the pixels 10.

Figure 2:
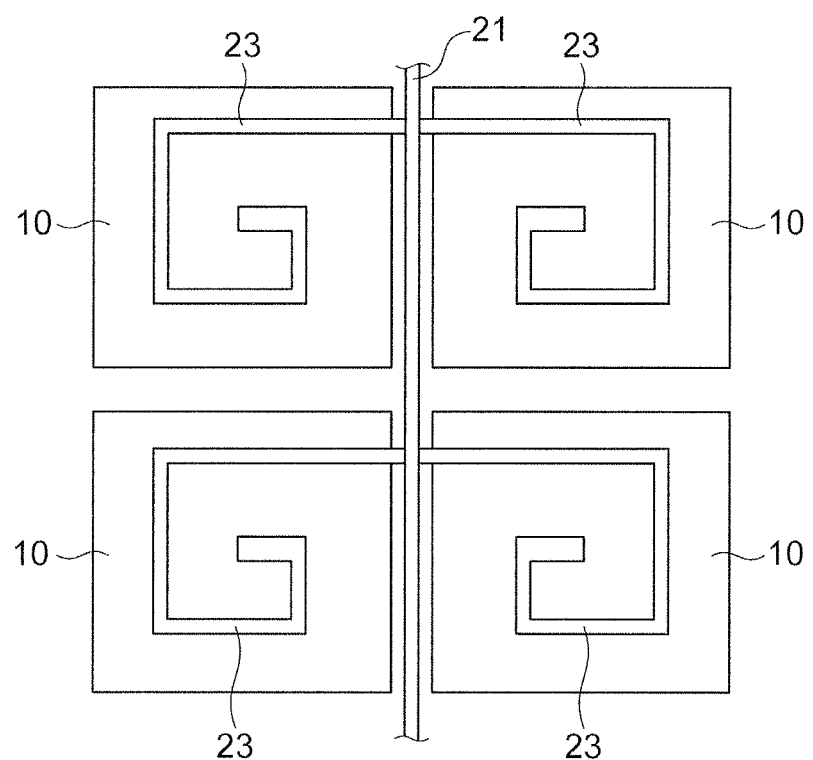
FIG. 2 is a plan view illustrating an enlarged part of a light receiving unit.

FIG. 2 is a plan view illustrating an enlarged part of the light receiving unit 3A. As illustrated in FIG. 2, the APD of each pixel 10 and the wire 21 are electrically connected via a quenching resistor 23. In other words, one end of the quenching resistor 23 is electrically connected to the APD of the pixel 10 and the other end is electrically connected to the wire 21. In an example, a resistance value of the quenching resistor 23 is 250 kΩ. Also, although the quenching resistor 23 is arranged in a spiral shape in the example illustrated in FIG. 2, the quenching resistor 23 can be arranged in various shapes, and may be arranged in, for example, a straight line shape. The quenching resistor 23 is formed of, for example, a conductive material with a light transmission property (translucence).

Figure 3:
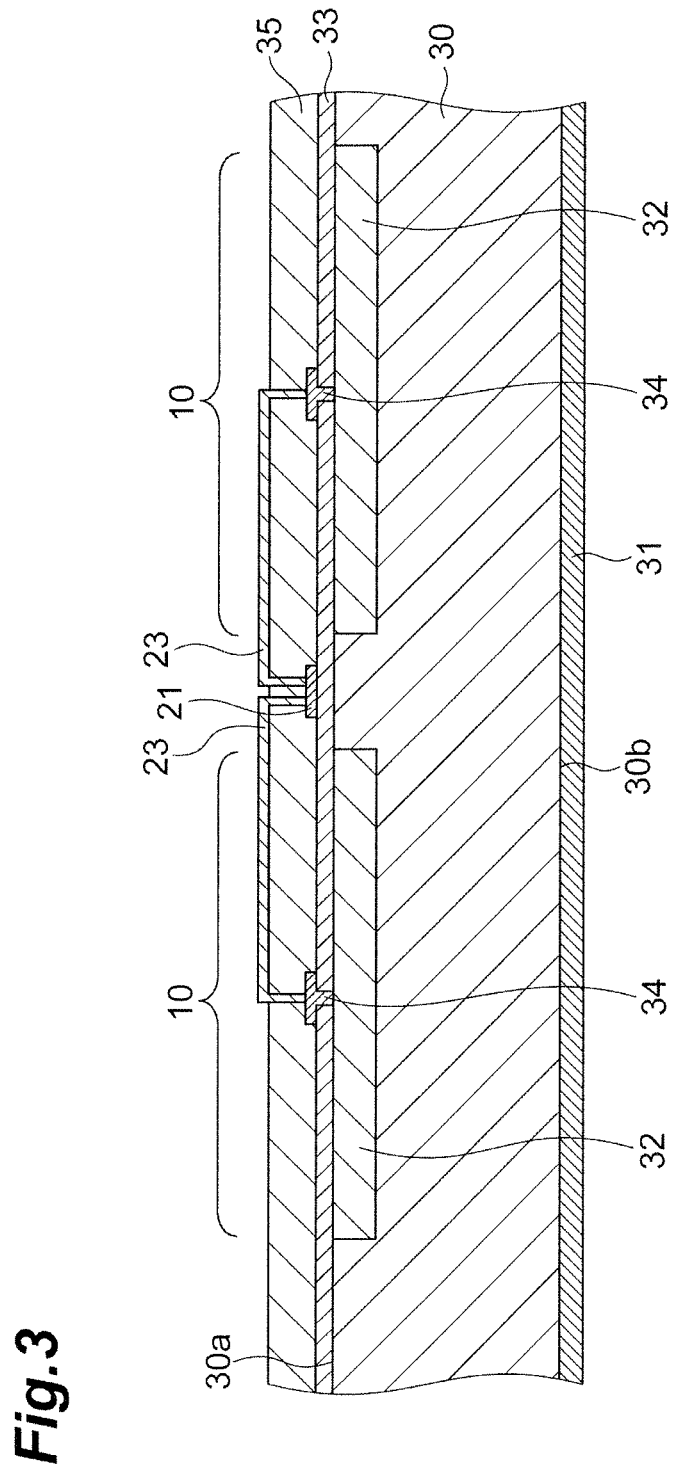
FIG. 3 is a diagram schematically illustrating a cross-sectional configuration of the photoelectric conversion element.

FIG. 3 is a diagram schematically illustrating a cross-sectional configuration of the photoelectric conversion element 1A. The photoelectric conversion element 1A includes a semiconductor substrate 30 formed of, for example, n-type Si. The above-described plurality of pixels 10 are formed in the common semiconductor substrate 30. Specifically, the semiconductor substrate 30 includes a principal surface 30a and a rear surface 30b, and a lower-surface electrode (a cathode) 31 is provided on the overall rear surface 30b. Also, inside the semiconductor substrate 30 including the principal surface 30a, a plurality of p-type semiconductor regions 32 constituting each of the pixels 10 are separated from one another and formed side by side. The p-type semiconductor region 32 is formed of, for example, p-type Si. The p-type semiconductor region 32 and the semiconductor substrate 30 form a pn junction, and thus the APD of the pixel 10 is configured.

A first insulation film 33 is provided on the overall surface of the principal surface 30a. Preferably, the first insulation film 33 can be constituted of, for example, an insulating silicon compound such as $SiO_2$ or SiN. A contact electrode (an anode) 34 is provided in the p-type semiconductor region 32 and the first insulation film 33. The contact electrode 34 is in contact with the p-type semiconductor region 32 via an opening formed in the first insulation film 33.

The wire 21 is a metallic material and is formed on the semiconductor substrate 30. In the present embodiment, the wire 21 is provided on the first insulation film 33 located in a region of the semiconductor substrate 30 in which the p-type semiconductor region 32 is not formed.

The wire 21, the first insulation film 33, and the contact electrode 34 are covered with a second insulation film 35. The second insulation film 35 covers the overall surface of the semiconductor substrate 30 and may preferably be constituted of an inorganic insulator such as, for example, $SiO_2$ or SiN. The above-described quenching resistor 23 is provided on the second insulation film 35. Each of one end and the other end of the quenching resistor 23 is electrically connected to one of the contact electrode 34 and the wire 21 via the opening formed in the second insulation film 35.

Figure 4:
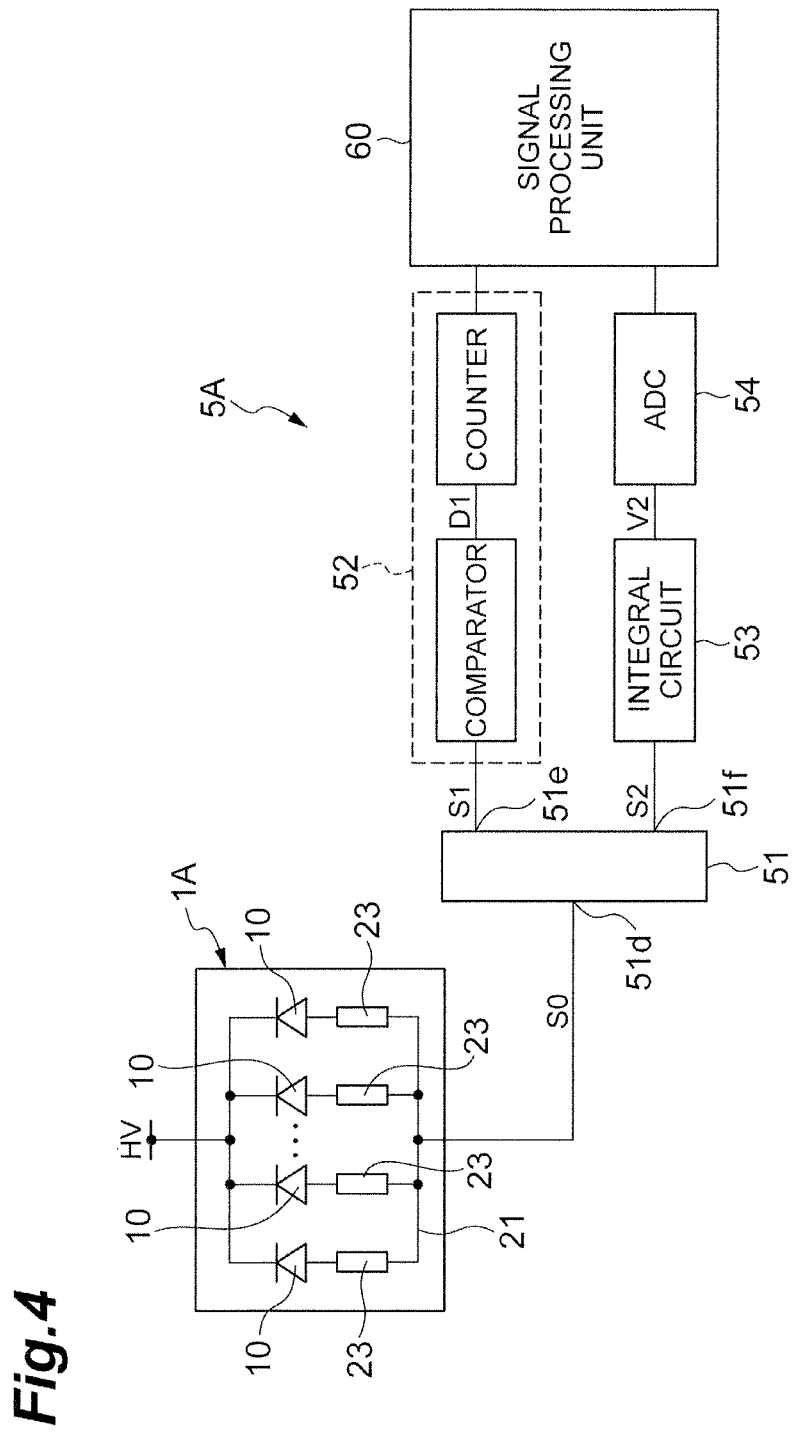
FIG. 4 is a diagram schematically illustrating a configuration example of a readout circuit.

Here, a configuration of a readout circuit for reading out an output current from the photoelectric conversion element 1A will be described. FIG. 4 is a diagram schematically illustrating a configuration example of the readout circuit 5A. Also, as illustrated in FIG. 4, a common bias voltage HV is applied to the cathode of each APD of the plurality of pixels 10, that is, the lower-surface electrode 31 (see FIG. 3).

The readout circuit 5A includes a current mirror circuit 51, a photon counting circuit 52, an integral circuit 53, an A/D converter 54, and a signal processing unit 60.

The current mirror circuit 51 is electrically connected to the wire 21 of the photoelectric conversion element 1A and receives batch output currents S0 from the plurality of pixels 10. The current mirror circuit 51 outputs a first current S1 and a second current S2 having magnitudes in proportion to the output current S0. Also, a ratio of the first current S1 to the output current S0 and a ratio of the second current S2 to the output current S0 are different from each other and are arbitrarily determined. These ratios are, for example, in a range of, for example, 1 to 1/1000. Also, in an example, the ratio of the first current S1 is greater than the ratio of the second current S2.

Figure 5:
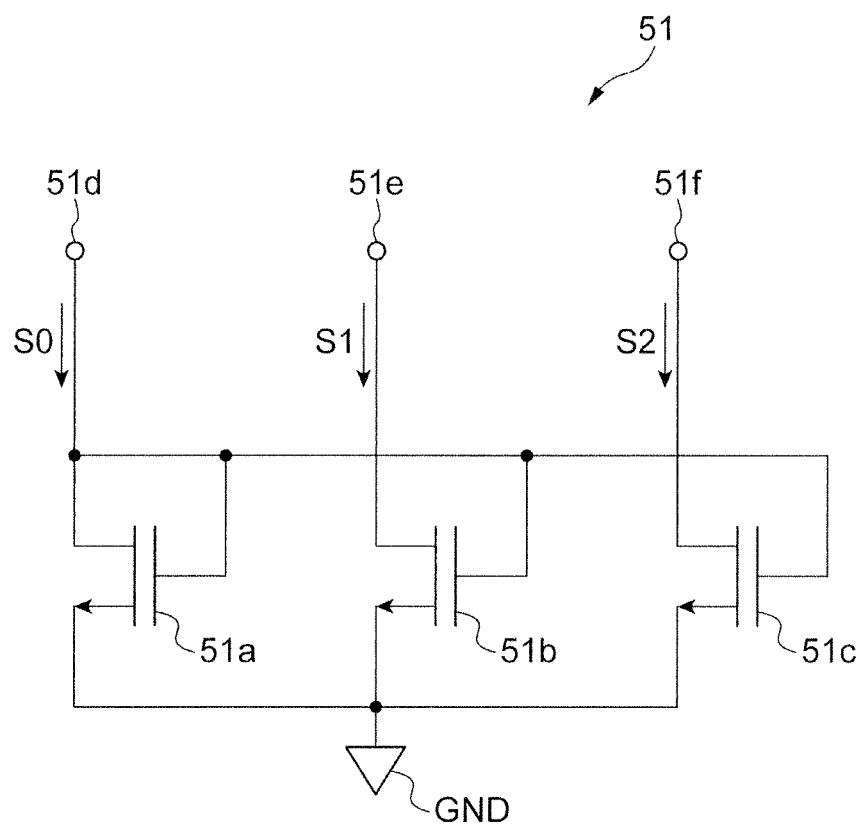
FIG. 5 is a circuit diagram illustrating an example of a specific circuit configuration of a current mirror circuit.

FIG. 5 is a circuit diagram illustrating an example of a specific circuit configuration of the current mirror circuit 51. The current mirror circuit 51 includes three transistors 51a to 51c. One current terminal of the transistor 51a is connected to the wire 21 via an input end 51d of the current mirror circuit 51 and receives the output currents S0 from the plurality of pixels 10. Each of control terminals of the transistors 51a to 51c is connected to the above-described one current terminal. The other current terminals of the transistors 51a to 51c are connected to a reference potential line (a GND line). According to this configuration, a current in proportion to the output current S0 flows through one current terminal of each of the transistors 51b and 51c. These currents are output as the first current S1 and the second current S2 from output terminals 51e and 51f.

Also, the transistors 51a to 51c may be bipolar transistors or FETs. When they are npn-type bipolar transistors, one current terminal is a collector, the other current terminal is an emitter, and a control terminal corresponds to a base. Also, when they are FETs, one current terminal is a drain, the other current terminal is a source, and a control terminal corresponds to a gate.

Also, for example, when the transistors 51a to 51c are NMOS-type FETs, the transistors 51a to 51c are the same in terms of carrier mobility, gate capacitance per unit area, a threshold voltage, or the like, and when the transistors are assumed to operate in a saturation region, ratios of the first current S1 and the second current S2 to the output current S0 (S1/S0 and S2/S0) are represented as follows using channel lengths La to Lc and channel widths Wa to Wc of the transistors 51a to 51c. That is, it is possible to set the ratios (S1/S0 and S2/S0) to arbitrary ratios by appropriately designing the channel lengths La to Lc and the channel widths Wa to Wc of the transistors 51a to 51c.

$$\frac{S1}{S0} = \frac{\frac{Wb}{Lb}}{\frac{Wa}{La}} \tag{1}$$

$$\frac{S2}{S0} = \frac{\frac{Wc}{Lc}}{\frac{Wa}{La}} \quad (2)$$

FIG. 4 will be referred to again. The photon counting circuit 52 is electrically connected to an output terminal 51e of the current mirror circuit 51 and counts the number of photons incident on the photoelectric conversion element 1A on the basis of the first current S1 output from the output terminal 51e. The photon counting circuit 52 of the present embodiment includes a comparator 52a and a counter 52b. The comparator 52a receives the first current S1, converts the first current S1 into a voltage signal, and compares the voltage signal with a predetermined reference voltage. When the voltage signal exceeds the reference voltage (that is, when a current pulse exceeding the threshold value is input as the first current S1), a signal D1 is output to the counter 52b. The counter 52b counts the number of outputs of the signal D1 from the comparator 52a. When an amount of incident light for the photoelectric conversion element 1A is small, its count value corresponds to a total amount of incident light for the plurality of pixels 10.

The integral circuit 53 is electrically connected to an output terminal 51f of the current mirror circuit 51 and generates a voltage signal V2 by integrating the second current S2 output from the output terminal 51f. Specifically, the integral circuit 53 is configured to include a capacitive element which stores the second current S2, a circuit which periodically resets charge stored in the capacitive element, and a hold circuit which periodically holds a voltage between the ends of the capacitive element. The integral circuit 53 outputs the voltage held in the hold circuit as a voltage signal V2. The A/D converter 54 converts the voltage signal V2 which is an analog signal into a digital signal. When the amount of incident light for the photoelectric conversion element 1A is relatively large, its digital value corresponds to a total amount of incident light for the plurality of pixels 10.

The signal processing unit 60 determines a magnitude of light incident on the photoelectric conversion element 1A (an amount of incident light) on the basis of a counting result output from the photon counting circuit 52 and a magnitude of a voltage signal V2 output from the integral circuit 53 (a digital value output from the A/D converter 54 in the present embodiment). The signal processing unit 60 adopts, for example, a structure having a significant value between the count value and the digital value, and specifies an amount of incident light on the basis of its value.

Figure 6:
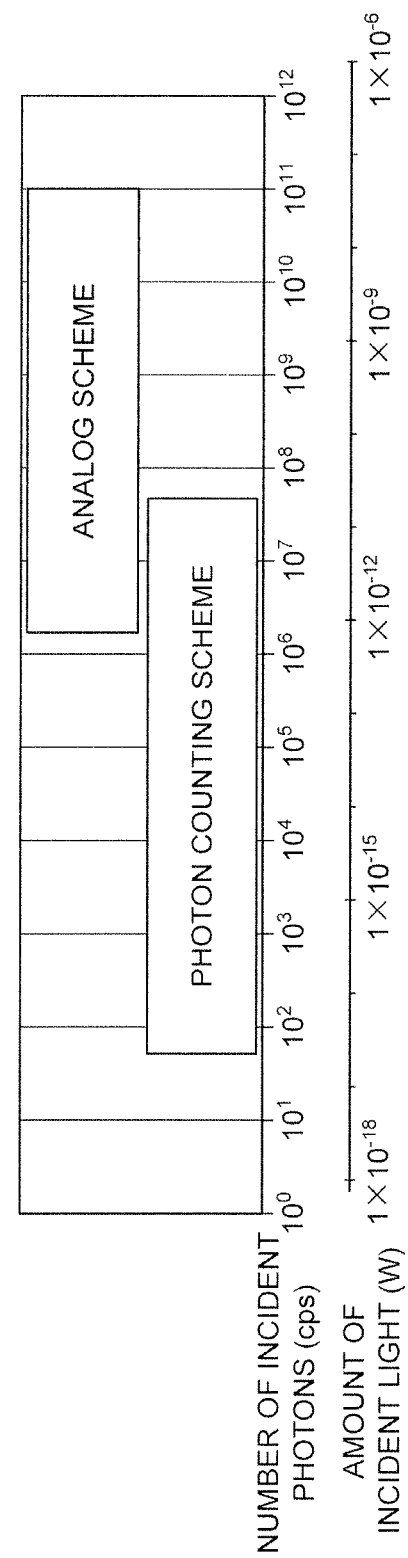
FIG. 6 is a diagram illustrating a valid range of detected amounts of light in each of a photon counting scheme and an analog scheme.

Effects obtained by the readout circuit 5A of the present embodiment described above will be described. FIG. 6 is a diagram illustrating a valid range of detected amounts of light in each of a photon counting scheme and an analog scheme (a scheme of converting an output current into a voltage signal). In FIG. 6, the horizontal axis represents the number of incident photons (units: counts/sec (cps)) and an amount of incident light (units: W). As illustrated in FIG. 6, it is possible to measure a relatively small range of amounts of light according to the photon counting scheme and to measure a relatively large range of amounts of light according to the analog scheme.

According to the readout circuit 5A of the present embodiment, a current mirror circuit 51 is provided, so that the first current S1 to be supplied to the photon counting circuit 52 and the second current S2 to be supplied to the integral circuit 53 can be obtained without affecting each other. Because a ratio of the second current S2 to the output current S0 can be freely determined, the integral circuit 53 can increase a saturation amount of light and sufficiently extend a range of amounts of light. Particularly, in the present embodiment, because the photoelectric conversion element 1A includes a plurality of pixels 10 each including the APD, the photoelectric conversion element 1A has a characteristic as a capacitive element and its capacitance affects a subsequent circuit. The current mirror circuit 51 provided in the readout circuit 5A not only distributes an output current from the photoelectric conversion element 1A into the two circuits 52 and 53, but also has a function of electrically separating the photoelectric conversion element 1A which is a capacitive element and subsequent circuits 52 and 53 from each other.

Figure 7:
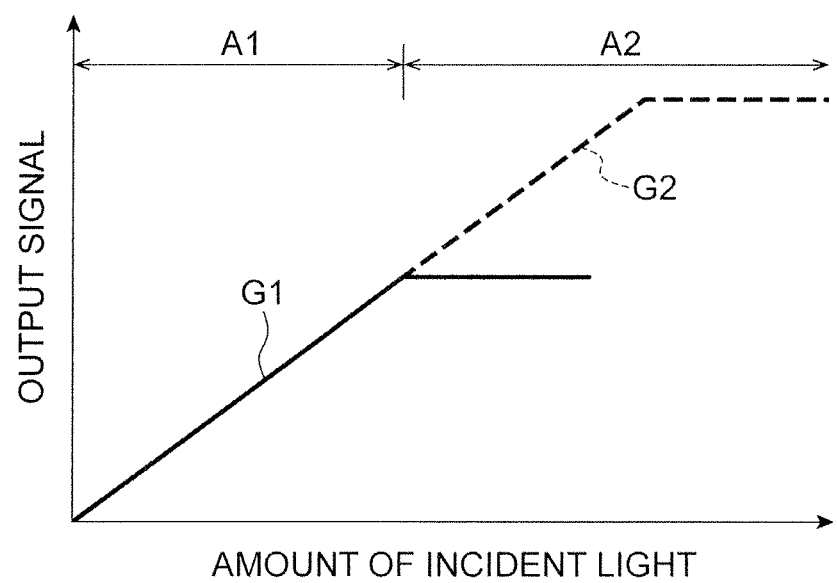
FIG. 7 is a graph conceptually illustrating an extension of a range of amounts of light by a readout circuit.

FIG. 7 is a graph conceptually illustrating an extension of a range of amounts of light by the readout circuit 5A of the present embodiment. In FIG. 7, the horizontal axis represents an amount of incident light and the vertical axis represents an output signal (a count value in the case of the photon counting scheme and a magnitude of a voltage signal in the case of an integral scheme). In a region A1 in which the amount of incident light is relatively small, the photon counting circuit 52 can precisely measure a small amount of light (graph G0. Also, in a region A2 in which an amount of incident light is relatively large (for example, an output from the photon counting circuit 52 is saturated), the integral circuit 53 can measure a sufficiently large amount of light without saturation (graph G2). Thus, it is possible to cope with a wide range of amounts of light according to the readout circuit 5A of the present embodiment.

Also, because the first current S1 and the second current S2 from the current mirror circuit 51 are used in measurement of an amount of light in the present embodiment, it is possible to individually set ratios of the first current S1 and the second current S2 to the output current S0 independently of each other. Accordingly, it is possible to set the ratio of the first current S1 to a ratio suitable for photon counting and set the ratio of the second current S2 to a ratio suitable for an integral process.

Also, in the photometric device for counting photons disclosed in Japanese Unexamined Patent Publication No. H3-181825, the wire extending from the photomultiplier tube and the photon counting circuit are subjected to AC coupling via a coupling capacitor. Accordingly, a current pulse is dull when passing through the coupling capacitor and a count rate is limited. Also, because the output terminal of the photomultiplier tube and a direct current component measuring circuit are directly connected, the direct current component measuring circuit is considered to be saturated early. Thus, an upper limit of a measurable range of amounts of light is suppressed to a low value. On the other hand, the readout circuit 5A of the present embodiment can perform DC coupling on the wire 21 of the photoelectric conversion element 1A and the photon counting circuit 52 via the current mirror circuit 51. Accordingly, it is possible to maintain a waveform of a current pulse and further increase a count rate. Also, the readout circuit 5A can further increase an upper limit of a measurable range of amounts of light by suppressing early saturation of the integral circuit 53 because it is possible to freely set the ratio of the second current S2 to the output current S0 in the current mirror circuit 51.

Also, as in the present embodiment, it is possible to easily design an application specific integrated circuit (ASIC) by distributing an output current for the photon counting circuit 52 and the integral circuit 53 according to the current mirror circuit 51 including a plurality of transistors.

Modified Example

Figure 8:
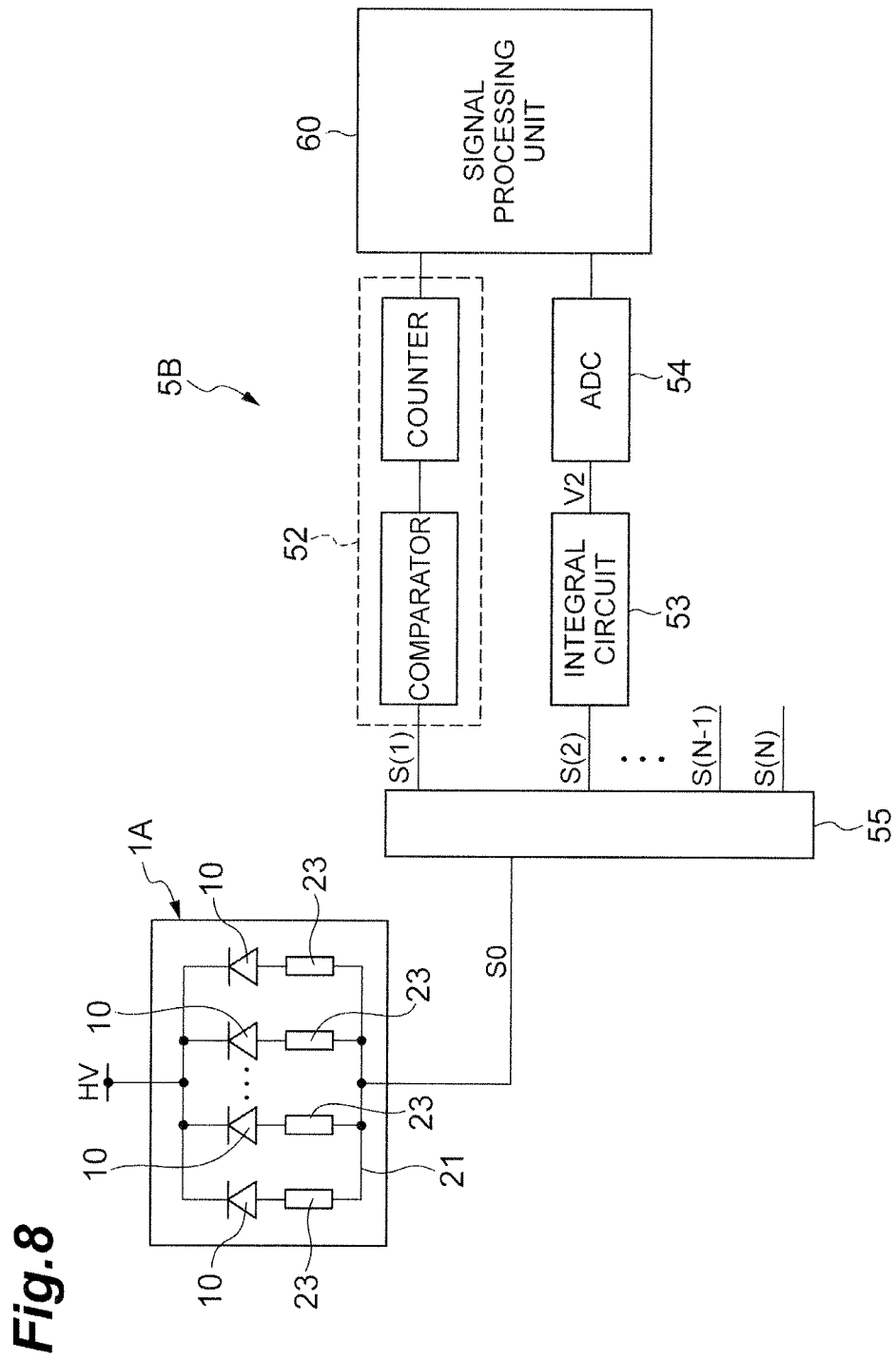
FIG. 8 is a diagram illustrating a configuration of a readout circuit according to a modified example.

FIG. 8 is a diagram illustrating a configuration of a readout circuit 5B according to a modified example of the above-described embodiment. A difference between the readout circuit 5B and the above-described embodiment is a configuration of a current mirror circuit. A current mirror circuit 55 provided in the readout circuit 5B is electrically connected to the wire 21 of the photoelectric conversion element 1A and receives an output current S0 from a plurality of pixels 10. The current mirror circuit 55 outputs N (N is an integer greater than or equal to 3) currents S(1) to S(N) having magnitudes in proportion to the output current S0. Ratios of the N currents S(1) to S(N) to the output current S0 are different from one another. The photon counting circuit 52 selectively inputs one current of the N currents S(1) to S(N) as the first current S1. The integral circuit 53 selectively inputs one current different from the current input to the photon counting circuit 52 among the N currents S(1) to S(N) as the second current S2. Also, the photon counting circuit 52, the integral circuit 53, and N output terminals of the current mirror circuit 55 are configured to be mutually switchable.

According to the present modified example, it is possible to easily change a ratio of an input current for the photon counting circuit 52 and a ratio of an input current for the integral circuit 53 to an output current from the photoelectric conversion element 1A. Accordingly, it is possible to easily select an appropriate ratio according to a characteristic, a field of application, or the like of the photoelectric conversion element connected to the readout circuit. Also, although it is possible to switch both of the input current for the photon counting circuit 52 and the input current for the integral circuit 53 in the modified example, one of the input currents may be fixed and only the other of the input currents may be switched.

The readout circuit according to an aspect of the present invention is not limited to the above-described embodiment and various modifications are possible. For example, the above-described embodiment and each modified example may be combined with each other when necessary. Also, the photon counting circuit and the integral circuit are connected to two output terminals of the current mirror circuit in the above-described embodiment, but another circuit for reading out may be further connected to another output terminal of the current mirror circuit.

What is claimed is:

1. A readout circuit for reading out an output current from a photoelectric conversion element which collectively outputs currents generated in a plurality of pixels, each of which includes an avalanche photodiode, the readout circuit comprising:
a current mirror circuit configured to receive the output current and output first and second currents having magnitudes in proportion to the output current;
a photon counting circuit configured to count the number of photons incident on the photoelectric conversion element on the basis of the first current;
an integral circuit configured to integrate the second current to generate a voltage signal;
a signal processing unit configured to determine a magnitude of light incident on the photoelectric conversion element on the basis of a counting result output from the photon counting circuit and a magnitude of the voltage signal output from the integral circuit;
the current mirror circuit outputs N (N is an integer greater than or equal to 3) currents having magnitudes in proportion to the output current;
ratios of the N currents to the output current are different from one another;
the photon counting circuit selectively inputs one current of the N currents as the first current;
the integral circuit selectively inputs one current different from the current input to the photon counting circuit among the N currents as the second current; and
the photon counting circuit, the integral circuit, and N output terminals of the current mirror circuit are configured to be mutually switchable.

* * * * *